United States Patent [19]

Millward et al.

[11] Patent Number: 4,811,016

[45] Date of Patent: Mar. 7, 1989

[54] CLAMPING CIRCUIT FOR AN ANALOG TO DIGITAL CONVERTER

[75] Inventors: John D. Millward, Kimpton; Kevin D. Brown, Bengeo, both of England

[73] Assignee: Rank Cintel Limited, Hertfordshire, United Kingdom

[21] Appl. No.: 921,593

[22] Filed: Oct. 21, 1986

[30] Foreign Application Priority Data

Oct. 21, 1985 [GB] United Kingdom ............... 8525861
May 15, 1986 [GB] United Kingdom ............... 8611863

[51] Int. Cl.$^4$ ............................................. H03K 13/02
[52] U.S. Cl. .................................. 341/126; 358/158; 358/172; 341/12
[58] Field of Search ....... 340/347 AD, 347 C, 347 M, 340/347 CC; 358/158, 172

[56] References Cited

U.S. PATENT DOCUMENTS

| | | | |
|---|---|---|---|
| 3,541,315 | 11/1970 | Naydan et al. | 340/347 M X |
| 4,513,278 | 4/1985 | Seitz et al. | 340/347 DA |
| 4,562,471 | 12/1985 | Eouzan et al. | 358/172 |

FOREIGN PATENT DOCUMENTS

| | | |
|---|---|---|
| 1426766 | 3/1976 | United Kingdom . |
| 1432998 | 4/1976 | United Kingdom . |
| 1533553 | 11/1978 | United Kingdom . |
| 1591786 | 6/1981 | United Kingdom . |

OTHER PUBLICATIONS

Patent Abstracts of Japan, vol. 1, No. 90 (E-037), Aug. 22, 1977 of JP-A-52-25556 (Hitachi Seisakusho K.K.) Feb. 25, 1977.

Y. Eto et al., "Digital Processing Amplifier and Color Encoder", SMPTE Journal, vol. 87, No. 1, Jan. 15-19, 1978, pp. 15-19.

EP-A-0 074 683 (Philips Electronic).

Patent Abstracts of Japan, vol. 7, No. 236 (E-205) [1381], Oct. 20, 1983 of JP-A-58-124373 (Nippon Hoso Hyokai) Jul. 23, 1983.

Primary Examiner—Bernard Roskoski
Attorney, Agent, or Firm—Ostrolenk, Faber, Gerb & Soffen

[57] ABSTRACT

A clamping circuit clamps a threshold of an analog to digital converter (ADC) to a signal level just below the black level of a television signal.

During the blanking period, a negative-going peak is superimposed on the input signal to produce the waveform. Each time this crosses the 0000,0001 threshold of the ADC, the polarity of the output of a comparator changes. The comparator compares the ADC output and a reference value.

The input signal is biased according to the integral of the comparator output. When signal levels are stable, the comparator output is symmetrical, its integral is zero and no change occurs in the biasing.

If signal levels drift, the negative going peak crosses the threshold for a second time relatively sooner or later. The comparator output becomes assymmetric and has a non-zero integral. Consequently, the biasing level changes to compensate for the drift.

30 Claims, 5 Drawing Sheets

CLAMPING CIRCUIT FOR AN ANALOG TO DIGITAL CONVERTER

BACKGROUND OF THE INVENTION

The present invention relates to analogue to digital conversion and to clamping signals, that is, ensuring that a particular part of a signal is held at a specified value.

The invention is applicable in a telecine projector, for example. A telecine projector is a device which converts images stored in the frames of movie film into television signals for display, recordal or transmission. The film images are projected onto an array of photoelectric sensors to generate an electrical signal which is subsequently processed to meet the requirements of a chosen television signal standard. It is desirable that at least some of the signal processing takes places digitally.

One function of the signal processing normally carried out in telecine equipment and television cameras, is known as gamma correction. Another is aperture correction. Gamma correction is applied to the signal to compensate for the non-linearity of the light output with respect to signal input of cathode ray tubes (CRTs), which will eventually display the signal. The light output is normally related to the signal input magnitude by a power law, typically with an index of about 2.5. Compensation is provided in the telecine projector by processing the output of the sensor array, which is assumed to have a linear response, according to a power law with an index which is approximately the reciprocal of the CRT response index, so that the light output of the CRT becomes linearly related to the light input to the sensor array. The index is typically 0.4, but in some circumstances may be as low as 0.2.

If gamma and aperture correction are carried out by analogue circuits, subsequent processing being digital, analogue to digital conversion with 8-bit resolution is found to give satisfactory performance. 8-bit analogue to digital converters (ADCs) capable of operation at up to 50 MHz are commercially available. This frequency is adequately high.

If digital circuits are also used to perform the gamma and aperture correction, 14-bit resolution is found to be necessary, with a sampling rate of at least 30 MHz. At the present time, a 14-bit ADC operable at this rate is not commercially available.

The problem can be overcome by using an ACD as shown in FIG. 1. This type of ADC is known, and is called herein an "iterative ADC". The interative ADC 10 receives an analogue input signal at 12. The analogue signal converted by an 8-bit ADC 14 to provide an output which, after a delay provided by a delay circuit 16, forms one input to an adder circuit 18.

The output of the ADC 14 is also converted back to an analogue signal by a digital to analogue circuit (DAC) 20, and compared by a comparator 22 with the original input signal at 12, which has been delayed by a delay circuit 24. The output from comparator 22 is a difference signal representing the difference between the actual input signal level at 12 and the level represented by the output of the ADC 14. This difference signal is amplified by a factor of 64 by an amplifier 25, and encoded by a further 8-bit ADC 26 to provide the second input to the adder 18. The amplification applied by the amplifier 25 gives the bits of this signal lower significance (by six binary positions) than the bits of the signal from the delay circuit 16. Thus, the adder 18 receives an 8-bit most significant byte from the delay circuit 16 and an 8-bit least significant byte from the ADC 26, the bytes overlapping by two binary places. These inputs ae combined to form a 14-bit output at 28. The overlap in the bits of the bytes allows the least significant byte to take positive or negative values.

When an iterative ADC is used to provide analogue to digital conversion in a telecine projector, before gamma correction, a problem is found to arise. At and near the black level of a signal, the signal level (but not necessarily the voltage level) is zero and small, respectively, and the gradient of the gamma correction power law is extremely high. It is found that if a change in the most significant byte takes place in this region of high gradient, small discrepancies in the gain of the amplifier 25 produce visible and detrimental effects in the final image. The flaws arise because the amplifier 25 will never, in practice, be perfectly linear in its response to have precisely the required gain, so that a small change in the input signal about a threshold of the ADC 14 will not be accurately reflected in the output signal at 28. Discontinuities and discrepancies in the output 28 are amplified by the steep gamma correction characteristic, and hence cause the visible flaws.

It is an object of the present invention to reduce subjective degradation of the final image caused by operation of the iterative ADC.

SUMMARY OF THE INVENTION

The present invention provides a clamping circuit for an analogue to digital converter, characterised in that is comprises combining means for combining an input signal and a reference signal to provide an input for the converter, and a negative feedback circuit for biassing the input for the converter. The feedback circuit comprises a comparator for comparing the converter output and a digital reference value to provide an output whose polarity depends on the result of the comparison, an integrator for integrating the comparator output, and means for biassing the input for the converter according to the level of the integrator output.

The clamping circuit according to the invention can be used in the iterative ADC to clamp the ADC providing the most significant byte (MSB) so that a change in the MSB takes place just below the black level of the input signal. This in turn ensures, as will be described below, that no change in the MSB will take place as signals move up and down the steepest portion of the gamma correction characteristic.

Clamping is applied to the MSB ADC (the ADC 14 of FIG. 1) rather than to the output of the ADC 10 for the following reasons. The clampinng circuit should have at least 14-bit resolution in order to locate the clamping level accurately, and so one possible arrangement would compare the output 28 with a reference signal and apply feedback to the input 12. However, the overlap in significance of the bits of the inputs to the adder 18 would make this arrangement unstable. There may be more than one possible set of inputs which give a particular output, and an ADC clamped in this way would have a tendency to oscillate between these alternative solutions, thereby changing the value of the MSB.

Accordingly, it is necessary to use separate clamping circuits for the ADCs 14, 26. A simple feedback loop may be applied to ADC 26, whose output has 14-bit resolution, but the output of ADC 14 has 8-bit resolution, which is insufficient for simple feedback to provide sufficiently accurate clamping. A clamping circuit according to the invention can clamp the ADC 14 and perform as though it has 14-bit or greater resolution, as will be described below.

The present invention also provides a method of clamping the output of an analogue to digital converter characterised in that a reference signal is combined with the input signal and negative feedback is applied from the converter output to bias the input signal, the output of the converter being compared with a digital reference value to generate a result signal whose polarity depends on the result of the comparison, the result signal being integrated to form an integral signal, and the biassing being set according to the value of the integral signal.

In a second aspect, the invention provides a signal processing circuit for analogue signals having periodic blanking periods during which the signal has a nominally constant voltage, characterized in that the circuit comprises an analogue to digital converter including clamping means operable to maintain a threshold of the converter at a voltage level relatively slightly displaced in one sense from the nominally constant voltage and to maintain the adjacent corresponding threshold of the converter to be relatively greatly displaced in the opposite sense from the nominally constant voltage, irrespective of the changes in the d.c. level of the signal.

The invention further provides, in its second aspect, a method of processing analogue signals having periodic blanking periods during which the signal has a nominally constant voltage, characterized in that the signals are converted by means of an analogue to digital converter, and the converter is clamped to maintain a threshold of the converter at a voltage level relatively slightly displaced in one sense from the nominally constant voltage and to maintain the adjacent corresponding threshold relatively greatly displaced in the opposite sense from the nominally constant voltage, irrespective of changes in the d.c. level of the signal.

Preferred features of the circuits and the methods according to the invention are recited in the subsidiary claims set out below and to which reference should now be made.

Figure 1:
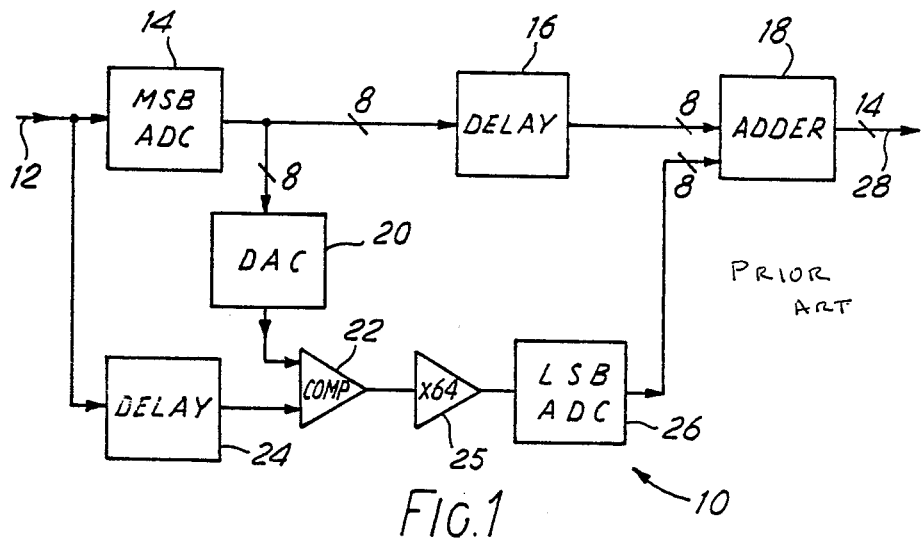
FIG. 1 is a block diagram of a known iterative analogue to digital converter.
Figure 3A:
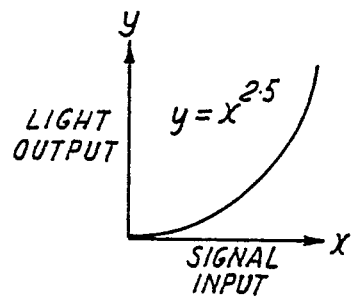
Figure 3B:
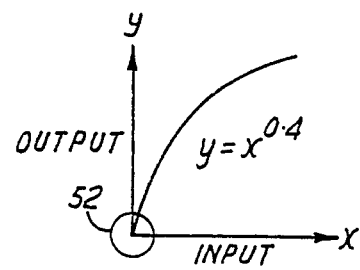
Figure 3C:
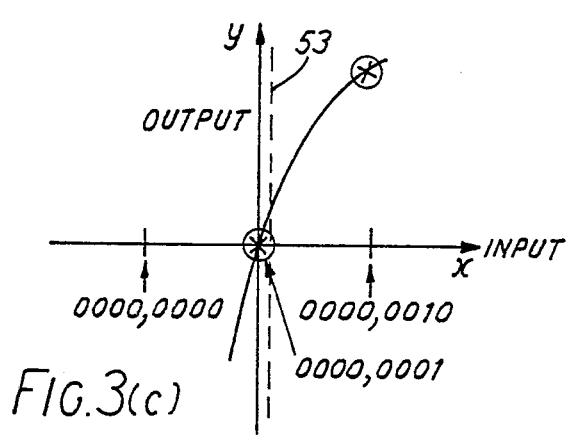
Figure 2:
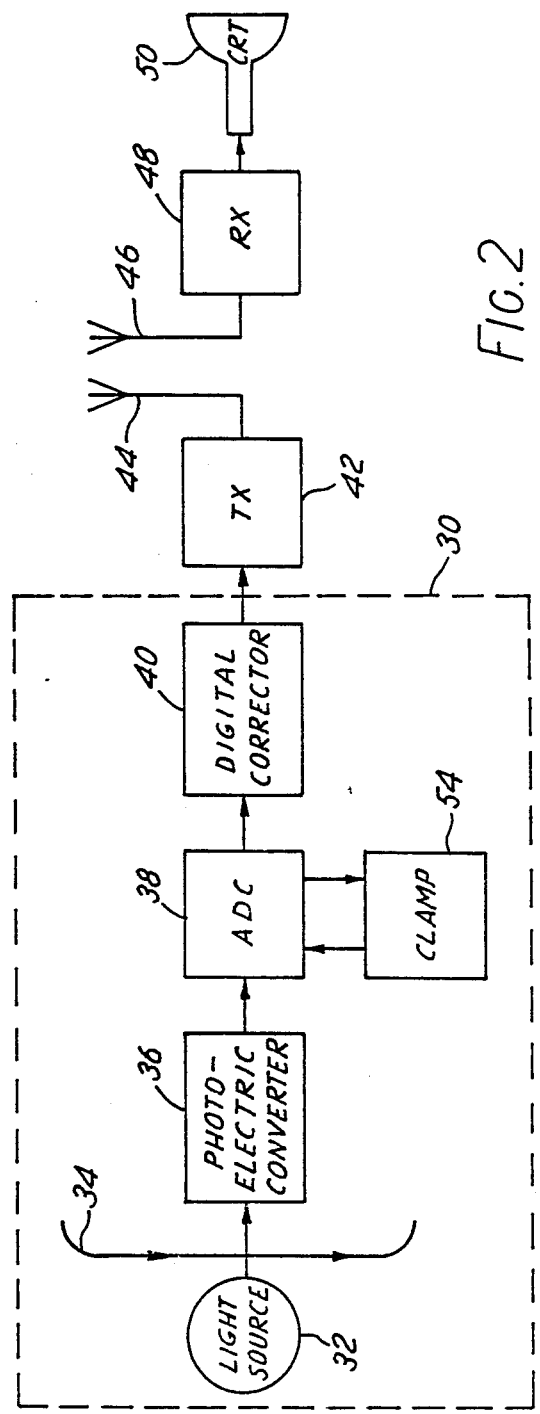
Figure 4:
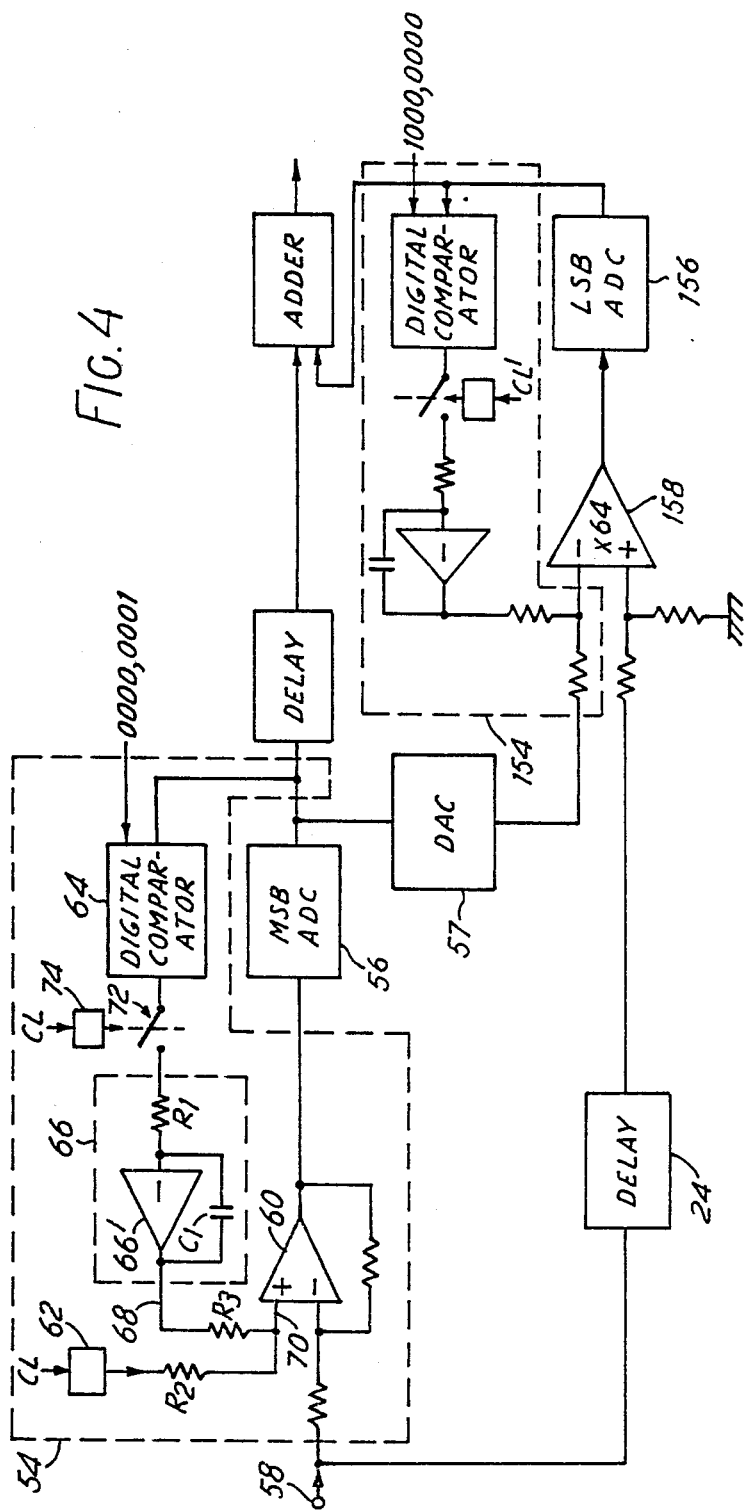
Figure 5:
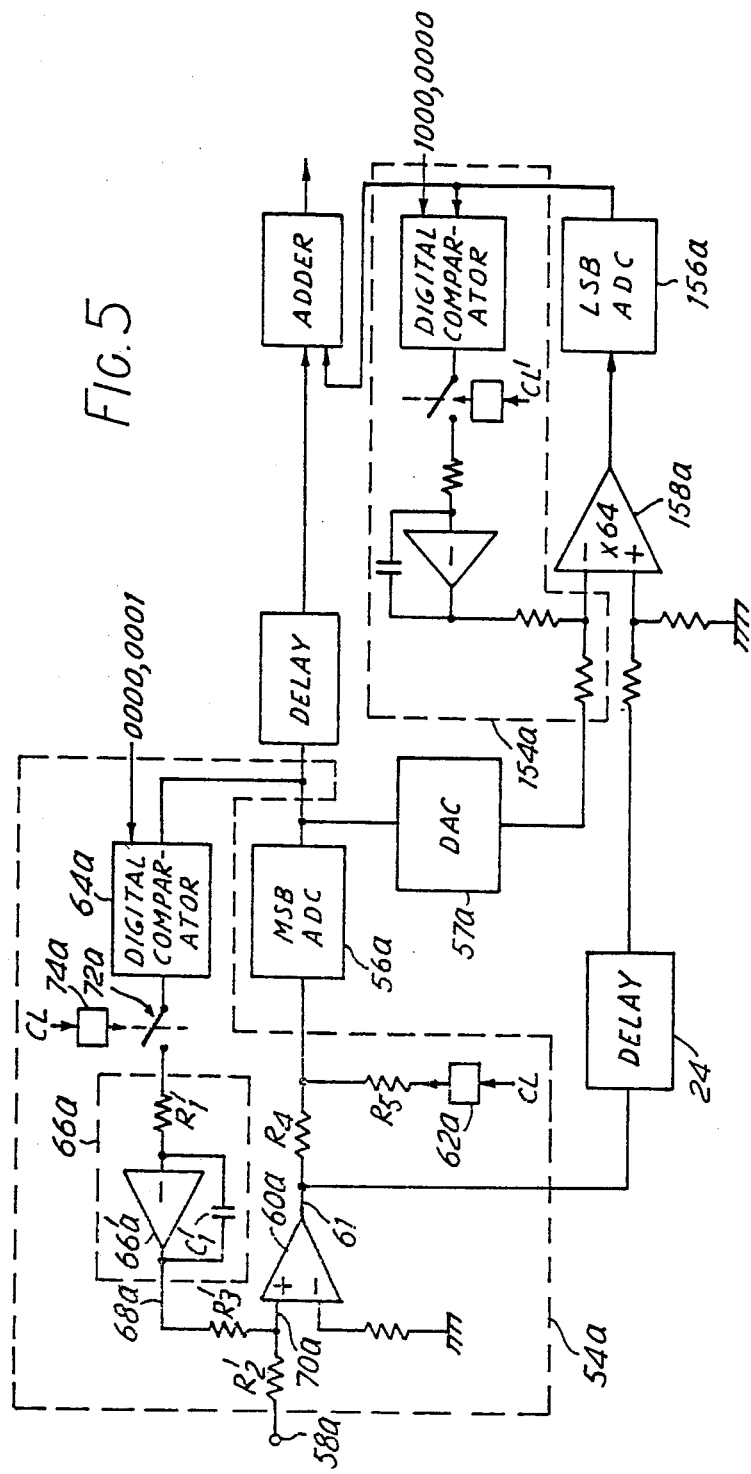
Figure 7:
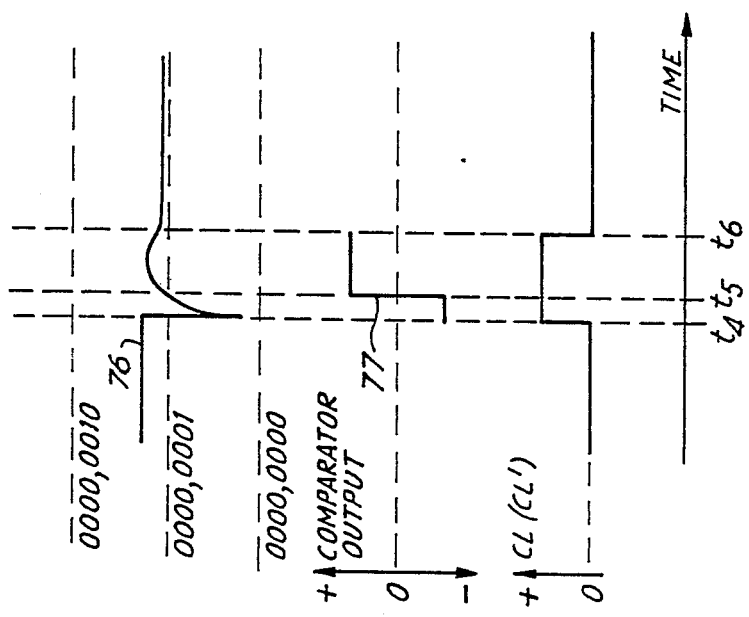
Figure 6:
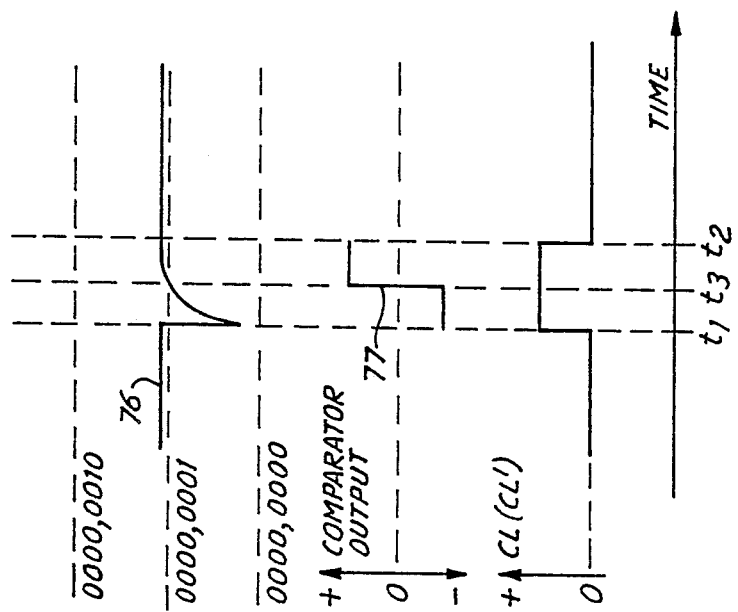

Embodiments of a clamping circuit according to the present invention, their operation and their application to an iterative ADC will now be described by way of example, and with reference to FIGS. 2 to 6 of the accompanying drawings in which:

FIG. 2 is a greatly simplified block diagram of a telecine system incorporating a clamping circuit according to the invention;

FIGS. 3(a), 3(b), 3(c) show the transfer characteristics of the digital corrector and the CRT of FIG. 2;

FIGS. 4 & 5 show clamping circuits according to the invention, connected to the ADC 14 of FIG. 1;

FIG. 6 shows the waveform of signals at various points in the circuits when the circuits have stabilised and the output is clamped to the desired level; and FIG. 7 shows the waveforms at the same points after the input signal levels have drifted up.

DETAILED DESCRIPTION OF PREFERRED EMBODIMENTS

Referring to FIG. 2, a telecine projector 30 comprises a light source 32. This projects images stored on the film 34 onto a converter 36 which converts the incident light into an electric current. This conversion is substantially linear, and gives rise to an analogue signal which encodes the film images line by line, each line of data being separated by a period in which the signal is "blanked", and takes the value corresponding to a black image. This value is known as the black level. Between the blanking periods, while the signal is carrying picture information, the signal is always displaced in the same sense with respect to the black level, or at the black level.

The analogue output of the converter 36 is converted to a digital signal by an ADC 38 to which a clamping circuit 54 is connected. Gamma and aperture correction are applied in a digital corrector circuit 40 and the signal is passed to a transmitter 42. The ADC 38 is an iterative converter like that of FIG. 1.

The signal is typically transmitted by means of a transmitting antenna 44, a receiving antenna 46 and a receiver 48, to a CRT 50.

The transfer characteristics of the CRT 50 and the corrector 40 are shown, respectively, in FIGS. 3(a) and 3(b). The light output (y) of the CRT is related to the signal input (x) by the equation $y = x^{2.5}$ as can be seen from FIG. 3(a). This non-linear characteristic is compensated for by the corrector circuit 40 whose output (y) is related to its input (x) by the equation $y = x^{0.4}$ Since $0.4 = 1/2.5$, and on the realistic assumption that all other elements of the system are substantially linear, the light output of the CRT is substantially linearly related to the light input to the converter 36.

The transfer characteristic of the corrector 40 is very steep at low input levels, as can be seen from FIG. 3(b). The low input signal region of FIG. 3(b) indicated by the circle 52 is shown in FIG. 3(c) on an enlarged scale. FIG. 3(c) also shows the input signal level 53 which corresponds to the black level, and the 8-bits of the MSB of the ADC 38, for various input signal levels. It can be seen from FIG. 3(c) that the MSB changes to 0000,0001 at a signal level just below the black level. Thus the next change in the MSB (to 0000,0010) takes place a relatively long way up the characteristic, when the gradient of the characteristic has reduced. At this latter signal level therefore, there will be less amplification of discontinuities in the output of the ADC 38 caused by changes in the MSB or by inaccuracies in the amplification applied to the output of the ADC's comparator (equivalent to the comparator 22 of FIG. 1), so that the image on the CRT is not flawed to an unacceptable degree.

One embodiment of the clamping circuit is shown in more detail in FIG. 4. Its purpose is to clamp a change in the MSB of the ADC to a signal level slightly below the black level, so that the situation shown in FIG. 3(c) is maintained, and the MSB does not change on the steepest part of the characteristic of the corrector 40. The MSB is provided by the ADC 56.

The circuit 54 receives an input signal at 58 from the converter 36 (FIG. 2). An operational amplifier 60 combines the input signal 58 with a reference signal from a generator 62 to provide an input to the ADC 56. The input to the ADC 56 is biased (that is, its D.C. level is controlled) by a feedback loop comprising a comparator 64 and an integrator 66.

The comparator 64 receives both the output of the ADC 56 and a digital reference value, here shown as the value 0000,0001, and provides an output whose polarity depends on the result of the comparison. In this embodiment, a positive current output is provided when the ADC output is equal to or greater than 0000,0001 and a negative current output is provided when the ADC output is less than this value.

The output of the comparator 64 is applied to the input of the integrator 66. The integrator 66 is a simple circuit based on an operational amplifier 66' whose inverting input is fed through a resistor $R_1$ and which has a capacitor $C_1$ connected between this input and its output. The integrator 66 provides a voltage at its output terminal 68 which is the negative integral of the current at its input. That is, a constant positive input current to the integrator 66 will cause a linear decrease in the voltage at 68.

The output 68 is used to apply d.c. bias to the input terminal 70 of the amplifier 60, and thereby to bias the amplifier output, which is the input of the ADC 56. The integrator output 68 and the generator 62 are connected through respective series resistors $R_3$, $R_2$ to the terminal 70. Thus, if the d.c. level of the generator output remains constant, a change in the integrator output voltage will change the d.c. level at 70 and the d.c. level of the output of the amplifier 60.

The circuit 54 further comprises a switch 72 which makes and breaks the connection between the comparator 64 and the integrator 66, under the control of a control circuit 74. The circuit 74 opens and closes the switch 72 in response to clamping pulses CL which are received during periods in which the signal input 58 is blanked and at the black level. When the switch 72 is open, the integrator 66 has no input current, and its output voltage remains constant.

The generator 62 also receives the clamping pulses C which trigger the generation of a negative-going peak to be described.

FIG. 4 also shows a second clamping circuit 154 connected to clamp the LSB ADC 156. The clamping circuit 154 is identical in structure and operation to the clamping circuit 54 except in one respect, and consequently is not described in detail. The difference is the absence of a signal generator equivalent to the generator 62 of the circuit 54. It is not necessary to generate reference signals in the LSB clamping circuit 154, because signals from the generator 62 can be used in this circuit also, as will be dsecribed.

The input to the LSB ADC 156 is the difference between the input signal at 58 and the signal represented by the output of the MSB ADC 56. This input is provided by a comparator 158 which incorporates an amplifier with a gain of x64. The clamping circuit 154 acts by biassing the negative input (which receives the output of the ADC 56 in analogue form) of the amplifier 158, so as to bias the input to the ADC 156. The negative input of the amplifier receives the input signal at 58 after it has been delayed by delay circuit 24.

An alternative embodiment of the clamping circuit is shown in FIG. 5. Many elements shown in FIG. 5 correspond to elements shown in FIG. 4, and where this is the case, the same numerals are used in FIG. 5, with the suffix a. The purpose of the circuit 54a is to clamp a change in the MSB of the ADC to a signal level slightly below the black level, so that the situation shown in FIG. 3(c) is maintained, and the MSB does not change on the steepest part of the characteristic of the corrector 40. The MSB is provided by the ADC 56a.

The circuit 54a receives an input signal at 58a from the converter 36 (FIG. 2). The input signal at 58a is applied to an operational amplifier 60a, which provides an output 61. The low output impedance of the amplifier 60a allows the signal at 61 to be combined (or mixed) with an output signal from a signal generator 62a, by means of resistors $R_4$ and $R_5$, to provide an input to the MSB ADC 56a. The amplifier 60a also allows the input 58a to be biassed (that is, its DC level to be controlled) by a feedback loop comprising a comparator 64a and an integrator 66a, as will be described. The output 61 is also taken, before the resistor $R_4$, for supply to the LSB ADC, through the delay circuit 24. This output is the biassed input 58a, but the output of the generator 62a is not superimposed on it.

The comparator 64a receives the output of the ADC 56a and a digital reference value, here shown as the value 0000,0001, and provides an output whose polarity depends on the result of the comparison. In the embodiment, a positive current output is provided when the ADC output is equal to or greater than 0000,0001 and a negative current output is provided when the ADC output is less than this value.

The output of the comparator 64a is applied to the input of the integrator 66a. The integrator 66a is a simple circuit based on an operational amplifier 66'a whose inverting input is fed through a resistor $R'_1$ and which has a capacitor $C'_1$ connected between this input and its output. The integrator 66a provides a voltage at its output terminal 68a which is the negative integral of the current at its input. That is, a constant positive input current to the integrator 66a will cause a linear decrease in the voltage at 68a.

The output 68a is used to apply d.c. bias to the input terminal 70a of the amplifier 60a, and thereby to bias the amplifier output, and hence the input of the ADC 56a. The integrator output 68a and the input 58a are connected through respective series resistors $R'_3$, $R'_2$ to the terminal 70a. Thus, if the d.c. level of the input at 58a remains constant, a change in the integrator output voltage will change the d.c. level at 70a and the d.c. level of the output of the amplifier 60a.

The circuit 54a further comprises a switch 72a which makes and breaks the connection between the comparator 64a and the integrator 65a, under the control of a control circuit 74a. The circuit 74a opens and closes the switch 72a in response to clamping pulses CL which are received during periods in which the signal input 58a is blanked and at the black level. When the switch 72a is open, the integrator 66a has no input current, and its output voltage, at 68a, remains constant.

The generator 62a also receives the clamping pulses CL which trigger the generation of a negative-going peak to be described.

FIG. 5 also shows a clamping circuit 154a for the LSB ADC 156a. The circuit 154a is identical in structure and function to the clamping circuit 154 of FIG. 4 and so is not described further here.

The operation of the clamping circuits 54, 54a will now be described, with reference to the waveforms shown in the remaining Figures.

FIG. 6 shows the signal levels at various points in the circuits 54, 54a, during the blanking period of the input signal 58, 58a when the ADC 56, 56a is clamped and the clamping has stabilised. In each case the vertical axis represents signal level and the three waveforms are plotted on the same, horizontal, time axis, shown at the bottom of the Figure.

The top waveform 76 represents the input of the ADC 56, 56a. Superimposed on the waveform are horizontal, broken lines indicating the signal levels at which the output of the ADC 56, 56a will change to the values indicated.

Initially the input waveform 76 is slightly above the threshold for the output 0000,0001. At a time $t_1$ indicated by a broken, vertical line, the output of the generator 62, 62a drops, substantially instantaneously, before rising exponentially to its former value, by a time $t_2$. This causes the input waveform 76 similarly to drop and rise between these times.

These changes in the output of the generator 62, 62a are initiated by the arrival of a pulse CL, CL', shown as the bottom waveform in FIG. 6, This pulse also causes the control circuit 74,74a to close the switch 72, 72a.

At time $t_1$, or very shortly thereafter, the input waveform 76 drops below the threshold for an ADC output of 0000,0001. The ADC output changes to 0000,0000. Since this value is less than 0000,0001, the output of the comparator 64, 64a now has a negative polarity. The polarity of the comparator output is shown by the middle waveform 77 in FIG. 5. At time $t_1$, the input of integrator 66, 66a is connected to the output of the comparator 64, 64a and begins to integrate, so that the voltage at 68, 68a begins to rise (since a negative integral of the comparator output current is generated).

Eventually, at time $t_3$, the exponentially rising level of the input 6 again crosses the threshold for an ADC output of 0000,0001. The ADC output changes, the comparator output changes polarity and the integrator output begins to drop. The input waveform 76 remains above the threshold between the times $t_3$ and $t_2$, and so the integrator output continues to drop until the time $t_2$. Then, the clamping pulse CL, CL' ends, the switch 72, 72a opens and the output of integrator 60 is locked to the value then obtained, until the start of the next CL, CL' pulse in the next blanking period.

In the situation indicated in FIG. 6, when the clamping circuit has settled down to a steady state, the rising exponential of the input waveform 76 will cross the threshold for 0000,0001 exactly midway between the times $t_1$ and $t_2$. This has two effects. Firstly, the integral of the comparator output between times $t_1$ and $t_3$ will be exactly equal in magnitude but opposite in polarity to the same integral between times $t_3$ and $t_2$. Thus, the output of the integrator 66, 66a is the same at $t_2$ as it was at $t_1$, and the biasing applied has not been changed by the clamping operation. Secondly, because of the nature of the exponential waveform, the level of the input waveform 76 at time $t_2$, which is equal to the level at time $t_1$, will be only slightly higher than the threshold for the output 0000,0001. Since the signal input at 58, 58a is equal to the black level at times $t_1$ and $t_2$, the output of the ADC 56, 56a is therefore clamped so that the threshold for the ADC output 0000,0001 lies a little below the black level of the input signal, and a subsequent increase in the level of the input 58, corresponding to movement of the signal along the steepest part of the gamma correction characteristic, will not change the output of the ADC 56. That is the 0000,0001 threshold is relatively close to and below the black level, and the 0000,0010 level is relatively far from and above the black level.

FIG. 7 indicates how the clamping circuits 54, 54a operate to clamp the 0000,0001 threshold back to a level just below the black level, in the event that a drift in d.c. level occurs. The waveforms shown in FIG. 7 occur at the same points in the circuits as the corresponding waveforms in FIG. 6.

When the input signal 58, 58a contains video information, that is during the period between clamp pulses, the switch 72, 72a is open, and the integrator output remains constant. This means that a constant bias will be applied to the ADC input. The output of the generator 62, 62a is nominally constant during this period.

If the d.c. level of the output of the generator 62, 62a or the black level of the input signal 58, 58a drifts during a line, for any reason, the input to the ADC 56, 56a will also drift, and accordingly, the separation between the 0000,0001 threshold and the black level will change.

The top waveform in FIG. 7 represents the input waveform 76 to the ADC 56, 56a when a drift has occurred during the previous line. The separation between the input waveform 76 and the 0000,0001 threshold is greater than it is just before the time $t_1$ in FIG. 6. At both of these times, the input signal 58, 58a is blanked and is at its black level, and so the 0000,0001 threshold is initially lower in relation to the black level in FIG. 7 than in FIG. 6. This means that the 0000,0010 threshold will have moved down onto a steeper part of the gamma correction characteristic. Unless the drift is corrected, degradation of the image on the CRT is likely to occur.

Correction is performed by the clamping circuit 54, 54a during the clamping pulse which begins at time $t_4$. At $t_4$, the generator 62, 62a is triggered to produce a negative-going peak with a vertical leading edge and exponential trailing edge. This peak is superimposed on the input waveform 58, 58a to give the ADC input 76.

At $t_4$, the output of the ADC 56, 56a changes to 0000,0000 and the output 77 of the comparator 64, 64a consequently has negative polarity, as described above in relation to FIG. 5. The integrator output begins to rise.

Eventually, at time $t_5$, the level of the input waveform 76 again crosses the 0000,0001 threshold, the comparator output reverses polarity and the integrator output begins to fall. The input waveform 76 remains above the threshold and the integrator output continues falling from the time $t_5$ until the time $t_6$ when the clamping pulse ends.

Unlike the situation shown in FIG. 6, the second crossing of the threshold by the input waveform 76 does not take place midway between the times $t_4$ and $t_6$, because the input waveform 76 is higher at $t_4$ than at $t_1$. The waveform 77 of the comparator output is, therefore, assymmetrical, and does not integrate to zero. The integrator output at time $t_6$ is less than the output at time $t_4$. The biassing applied by the circuit 54, 54a to the input signal 58 has therefore been lowered to compensate for the upward drift of the input signal. This change restores the 0000,0001 threshold of the ADC to the desired position just below the level of the input waveform 76 when the input signal 58, 58a is at black level.

If the level of the input waveform 76 drifted down, it would cross the threshold for the second time relatively late in the duration of the clamping pulse, and the biassing applied would increase, so as to restore the correct relationship.

The LSB clamping circuit 154, 154a are set in the same way as has been described with relation to FIGS.

6 and 7. In these LSB clamping circuits the digital reference value 1000,0000 is used. This represents the midpoint of the range of possible values provided by the ADC 56, and is used in preference to 0000,0001 because the difference signal from the comparator 158 can be positive or negative. The MSB and LSB clamping circuits are preferably set at different times during the blanking period, by respective clamping pulses, to prevent the operation of one clamping circuit (including changing the output of the corresponding ADC) interfering with the operation of the other clamping circuit. For this reason, a reference signal generator is not required in the LSB clamping circuits 154, 154a. Reference signals provided by the generators 62, 62a appear on the output of the DAC 57, 57a. Accordingly, signals from the generators 62, 62c can be used for clamping both the MSB and the LSB ADCs 56, 156, 55a, 156a. When the generators 62, 62a are used in this way, they are supplied with both clamping pulses CL, CL' and generate a reference signal in response to each.

The circuits of FIGS. 4 and 5 differ principally in the selection of the point at which the input to the LSB ADC is taken. Taking this input at the output of the comparator 60a, as in FIG. 5, means that the delay circuit 24 does not have to compensate for delays within the comparator 60a. Furthermore, the clamping circuit 54a corrects for drift in the input signal 58a before the signal is diverted to the LSB ADC, so that the clamping circuit 154a is only required to compensate for drift within itself, the LSB ADC or the circuitry between the LSB ADC and the MSB ADC. The circuits of FIGS. 4 and 5 also differ in the point of application of the reference signal. In each case this is applied after the signal for the LSB ADC has been taken. This choice also is made to prevent the two clamping circuits interfering with each other.

It can be seen from the above that the clamping circuit provides negative feedback between the ADC output and input to clamp an ADC threshold not to a characteristic level of the input signal, as simple negative feedback would do, but to a level just below this characteristic level. In this sense, the clamping circuit has a resolution higher than the resolution of the ADC 56. The separation of the black level and the clamped threshold is set by the characteristics of the reference waveform and so the accuracy of clamping is determined by the accuracy with which the reference waveform can be generated, and the choice of reference waveform.

The ADC threshold which is clamped is set by the reference input to the comparator 64, since this determines the value of the ADC output at which the comparator output polarity changes. In the embodiment described, the threshold for a low output value is chosen for the MSB, because signals a long way below the black level are not normal.

The bias provided by the integrators could be utilised at various points in the circuits if due regard is had of the polarities of signals and signal changes at these points, so as to ensure that the overall effect is to provide negative feedback between the output and input of the ADC, that is, feedback which acts to change the D.C. level of the input to the ADC in the opposite direction to any drift in the level. Furthermore, the integrators could be used to provide a positive or negative integral, according to the point of the circuit at which the feedback signal is applied and to whether the outputs of the ADCs and the comparators have the same phases or opposite phases as the corresponding inputs.

One alernative arrangement which has been found advantageous uses inverting ADCs, which generate an output 1111,1111 in response to a zero input, and a decreasing output in response to an increasing input. The digital reference values 1111,1101 and 1011,0000 are used for clamping the MSb and LSB respectively. These add to give an input of 11,1111,1111,0000 at black level. After inversion to restore the original polarity, this output becomes 00,0000,0000,1111, so that a contrast range of approximately 10000:1 is possible in the output signal.

The circuit has been described in use in a telecine projector, but could be used in other television apparatus, such as television cameras. Moreover, the applications of the circuit are not restricted to television systems. The circuit can be used whenever an analogue signal to be converted to a digital signal has regularly occurring constant value plateaux, corresponding to television blanking periods, and there is a requirement to clamp a threshold of the ADC to a slightly different level.

If desired, a threshold could be clamped to a level just above a plateau by, for instance, arranging the generator 62 to produce a positive going spike and the integrator to generate a positive integral.

The exponential trailing edge of the peak generated by the generator 62 could be replaced by another wavefrom such as a linear trailing edge, giving the generator output a sawtooth waveform. However, the amplitude of the peak would then be much less, in order to provide the same separation between the threshold level and the black level. Decreasing the amplitude of a signal generally leads to increasing difficulty in accurate generation of the signal, and so the use of an exponential or other non-linear trailing edge is preferred.

We claim:

1. A circuit for converting an analogue input signal having information periods which are separated by blanking periods to a digital output signal, said converter circuit comprising:

(A) an analogue to digital converter for generating said digital output signal as a function of a clamped analogue signal applied thereto;

(B) a clamping circuit for clamping said input signal to a level which is spaced by a predetermined amount from a reference signal, said clamping circuit including:

(1) reference signal generating means for providing an analogue reference signal which is nominally constant during said information periods but which spikes to a peaked level and then returns to its constant level during said blanking periods;

(2) a negative feedback circuit for generating a biasing signal during said blanking periods as a function of said digital output signal, said feedback circuit comprising:

(a) a comparator for comparing said digital output signal with a digital reference value to provide an output whose polarity depends on the result of said comparison;

(b) an integrator for integrating said output of said comparator and generating said biasing signal as a function thereof; and (C) means for combining said analogue input signal, said biasing signal and said reference signal to generate said clamped analogue signal as a function thereof.

2. Apparatus according to claim 1, wherein said combining means first combines said first input signal and said biasing signal and then combines the resultant signal with said reference signal.

3. Apparatus according to claim 1, wherein said combining means first combines said reference signal and said biasing signal and then combines the resultant signal with said first input signal.

4. Apparatus according to claim 1, in which said comparator output has positive and negative polarity when the converter is more than and less than said digital reference value, respectively, and said integrator generates a negative integral of its input.

5. Apparatus according to claim 1, further comprising a switch operable to make or break a connection between said comparator and said integrator.

6. Apparatus according to claim 5, comprising means for closing said switch only during said blanking periods.

7. Apparatus according to claim 1, in which said reference signal spikes a negative-going peak which has a substantially vertical leading edge and a substantially exponential trailing edge.

8. Apparatus according to claim 1, in which said integrator and said combining means each comprise an operational amplifier.

9. A signal processing circuit for analogue signals having periodic blanking periods during which the signal has a nominally constant voltage, the circuit comprising:
an analogue to digital converter; and
clamping means operable to maintain a threshold of said converter at a voltage level relatively slightly displaced in one sense from said nominally constant voltage and to maintain the adjacent corresponding threshold of said converter to be relatively greatly displaced in the opposite sense from said nominally constant voltage, irrespective of changes in the d.c. level of said signal.

10. Apparatus according to claim 9, wherein said analogue input signal is an analogue television signal, and further comprising a gamma correction circuit for correcting the output of said converter.

11. Apparatus according to claim 9 wherein the maintained threshold is a threshold corresponding to a change in the most significant bit provided by said converter.

12. Apparatus according to claim 10 wherein said converter is an iterative converter.

13. Apparatus according to claim 9, wherein the maintained threshold is a threshold corresponding to a change in the most significant byte provided by said converter.

14. A signal processing unit for analogue signals having periodic blanking periods during which the signal has a nominally constant voltage, the circuit comprising:
(A) an analogue to digital converter; and
(B) clamping means operable to maintain a threshold of said converter at a voltage level relatively slightly displaced in one sense from said nominally constant voltage and to maintain the adjacent corresponding threshold of said converter to be relatively greatly displaced in the opposite sense from said nominally constant voltage, irrespective of changes in the d.c. level of said signal; said clamping means comprising:
(1) means for providing a reference signal which is nominally constant except during said blanking periods, said reference signal spiking to a peak level and then returning to its constant level during said blanking periods;
(2) combining means for combining an input signal and said reference signal to provide an input for said converter; and
(3) a negative feedback circuit for biasing the input for said converter, said negative feedback circuit comprising:
(a) a comparator for comparing the output of said converter with a digital reference value to provide an output whose polarity depends on the result of the comparison;
(b) an integrator for integrating the output of said comparator; and
(c) means for biasing the input of said converter according to the level of the output of said integrator.

15. A method of clamping the output of an analogue to digital converter in which:
a reference signal which is nominally constant except during blanking periods of the input signal to converter, and having peaks which occur during said blanking periods is combined with the input signal and negative feedback is applied from the converter output to bias the input signal;
the output of the converter being compared with a digital reference value to generate a result signal whose polarity depends on the result of the comparison;
the result signal being integrated to form an integral signal; and
the biasing being set according to the value of the integral signal.

16. A method according to claim 15 including biassing the input signal before the signals are combined.

17. A method according to claim 15 including biassing the reference signal before the signals are combined.

18. A method according to claim 15 in which the result signal has positive and negative polarity when the converter output is more and less, respectively, than the reference value, and a negative integral of the result signal is formed.

19. A method according to claim 15 wherein integration only takes place during blanked periods of the input signal and wherein the biassing level is held at the level obtaining at the end of a blanking period during the succeeding unblanked period.

20. A method according to claim 15 in which said peak is negative-going and at a substantially vertical leading edge and a substantially exponential trailing edge.

21. A method of clamping a stage in an interative analogue to digital converter in which:
a reference signal which is nominally constant except during blanking periods of the input signal to converter, and having peaks which occur during said blanking periods is combined with the input signal and negative feedback is applied from the converter output to bias the input signal;
the output of the converter being compared with a digital reference value to generate a result signal whose polarity depends on the result of the comparison;

the result signal being integrated to form an integral signal;

the biasing being set according to the value of the integral signal; and the input signal being provided as an output for use in a following stage before the input signal is combined with the reference signal.

22. A method according to claim 21 including biassing the input signal before the signals are combined.

23. A method according to claim 21 wherein the output for the following stage is the biassed input signal.

24. A method of processing analogue signals having periodic blanking periods during which the signal has a nominally constant voltage, wherein;

the signals are converted by means of an analogue to digital converter; and the converter is clamped to maintain a threshold of the converter at a voltage level relatively slightly displaced in one sense from the nominally constant voltage and to maintain the adjacent corresponding threshold relatively greatly displaced in the opposite sense from the nominally constant voltage, irrespective of changes in the d.c. level of the signal.

25. A method according to claim 24, applied to television signals, in which gamma correction is applied to the output of the converter.

26. A method according to claim 24, wherein the maintained threshold is a threshold corresponding to a change in the most significant bit provided by the converter.

27. A method according to claim 24, in which the converter is an iterative converter.

28. A method of processing analogue signals having periodic blanking periods during which the signal has a nominally constant voltage, wherein:

the signals are converted by means of an analogue to digital converter;

the converter is clamped to maintain a threshold of the converter at a voltage level relatively slightly displaced in one sense from the nominally constant voltage and to maintain the adjacent corresponding threshold relatively greatly displaced in the opposite sense from the nominally constant voltage, irrespective of changes in the d.c. level of the signal;

a reference signal which is nominally constant except during blanking periods of the input signal to converter and having peaks which occur during said blanking periods is combined with the input signal and negative feedback is applied from the converter output to bias the input signal;

the output of the converter being compared with a digital reference value to generate a result signal whose polarity depends on the result of the comparison;

the result signal being integrated to form an integral signal; and the biasing being set according to the value of the integral signal.

29. A telecine projector comprising an analogue to digital converter for converting video signals generated by scanning a film image, and a clamping circuit comprising:

means for providing a reference signal which is nominally constant except during blanking periods of the input signal to said converter and having peaks which occur during said blanking periods;

combining means for combining an input signal and said reference signal to provide an input for said converter;

a negative feedback circuit for biasing the input of said converter, said negative feedback circuit comprising:

a comparator for comparing the output of said converter with a digital reference value to provide an output whose polarity depends on the result of the comparison;

an integrator for integrating the output of said comparator;

means for biasing the input of said converter according to the level of the input of said integrator; and the clamping circuit being arranged to clamp a transition in the converter input to a signal level just below the black level of the video signal.

30. An iterative analogue to digital converter including first and second stages, said first stage of said iterative analogue/digital converter comprising:

(A) an analogue to digital converter for generating said digital output signal as a function of a clamped analogue signal applied thereto;

(B) a clamping circuit for clamping said input signal to a level which is spaced by a predetermined amount from a reference signal, said clamping circuit including:

(1) reference signal generating means for providing an analogue reference signal which is nominally constant during said information periods but which spikes to a peaked level and then returns to its constant level during said blanking periods;

(2) a negative feedback circuit for generating "said biasing signal" during said blanking periods as a function of said digital output signal, said feedback circuit comprising:

(a) a comparator for comparing said digital output signal with a digital reference value to provide an output whose polarity depends on the result of said comparison, and (b) an integrator for integrating said output of said comparator and generating "said biasing signal" as a function thereof; and (C) means for combining said analogue input signal, "said biasing signal" and said reference signal to generate said clamp analogue signal as a function thereof, said clamped analogue signal being applied as an input to said second stage of said iterative converter.

* * * * *